US005124883A

United States Patent [19]

Bakker

[11] Patent Number: 5,124,883

[45] Date of Patent: Jun. 23, 1992

[54] PRINTED CIRCUIT BOARD POWER PLUG CONTACT

[75] Inventor: Roel J. Bakker, Livermore, Calif.

[73] Assignee: Elcon Products International Company, Fremont, Calif.

[21] Appl. No.: 606,428

[22] Filed: Oct. 31, 1990

[51] Int. Cl.[5] .......... H05K 7/20

[52] U.S. Cl. .......... 361/386; 361/352; 439/485

[58] Field of Search .......... 361/352, 386-389, 361/400, 404-406, 407, 413; 439/485-487

[56] References Cited

U.S. PATENT DOCUMENTS

| | | | |
|---|---|---|---|
| 3,783,321 | 1/1974 | Patterson | 361/404 |
| 3,880,486 | 4/1929 | Avakian | 361/406 |
| 3,955,122 | 5/1976 | Maynard et al. | 361/388 |

*Primary Examiner*—Gregory D. Thompson
*Attorney, Agent, or Firm*—Flehr, Hohbach, Test, Albritton & Herbert

[57] ABSTRACT

A power plug (10) for a printed circuit board (12) has a main contact body (30). The body (30) has a generally cylindrical portion (32), which is threaded at (34) on its outside surface along its length. An integral spring contact portion (36) projects from the cylindrical portion (32). The spring contact portion (36) has enlarged tips (46) and a pair of opposed slots (48). The portion (36) extends through a board contact and heat sink (50) and has a contact ridge (52), which engages the plated through main contact hole (24). The plug (10) is installed by first inserting legs (54) of the board contact-/heat sink (50) into mounting holes (26). Spring contact portion (36) of the contact body (30) is then inserted through the board contact/heat sink (50) into the main contact hole (24) of the printed circuit board (12), with the enlarged tips (46) extending along the greater diameter of the oval. The main contact body is then rotated 90 degrees, so that the enlarged tips (46) engage the back side (22) of the printed circuit board (12).

11 Claims, 2 Drawing Sheets

PRINTED CIRCUIT BOARD POWER PLUG CONTACT

BACKGROUND OF THE INVENTION

1. Field of the Invention

The present invention relates generally to a perpendicular plug for transmitting power to printed circuit boards. More particularly, it relates to such a perpendicular plug which is readily attached to the printed circuit board without soldering and without requiring access to the back side of the printed circuit board.

2. Description of the Prior Art

A variety of perpendicular plug designs for transmitting power to printed circuit boards are known in the art. Typically, such plugs are soldered to the printed circuit board and/or require access to the back side of the circuit board to attach the plugs to the circuit board. These requirements complicate system assembly and subject the circuit boards to thermal stresses from heating. It would therefore be desirable to provide a perpendicular plug for transmitting power to printed circuit boards that neither requires soldering or circuit back side access for attachment.

SUMMARY OF THE INVENTION

Accordingly, it is an object of this invention to provide a perpendicular plug for transmitting power to a printed circuit board which is mechanically mounted to the printed circuit board, without soldering.

It is another object of the invention to provide such a perpendicular plug which is front mounted to the printed circuit board, with no necessity to access the back side of the printed circuit board.

It is a further object of the invention to provide such a perpendicular plug which requires no additional parts to be mounted on the back of the printed circuit board in order to attach the perpendicular plug to the printed circuit board.

It is still another object of the invention to provide such a perpendicular plug in which the plug provides a positive lock for attachment to the printed circuit board and a contact pin of the plug is a positive lock into the plug.

The attainment of these and related objects may be achieved through use of the novel printed circuit board power plug and contact incorporated in the plug herein disclosed. A printed circuit board power plug in accordance with this invention has a main contact body. An integral contact portion projects from the main contact body. The integral contact portion is configured and dimensioned to extend through a main contact aperture from an upper surface of a printed circuit board beyond a lower surface of the printed circuit board. A means on the integral contact portion engages the lower surface of the printed circuit board when the integral contact portion is extended through the main contact aperture beyond the lower surface of the circuit board. A means on the main contact body for engaging the upper surface of the printed circuit board locks the plug in position on the printed circuit board.

The attainment of the foregoing and related objects, advantages and features of the invention should be more readily apparent to those skilled in the art, after review of the following more detailed description of the invention, taken together with the drawings, in which:

DETAILED DESCRIPTION OF THE INVENTION

Figures 1, 2, 3:
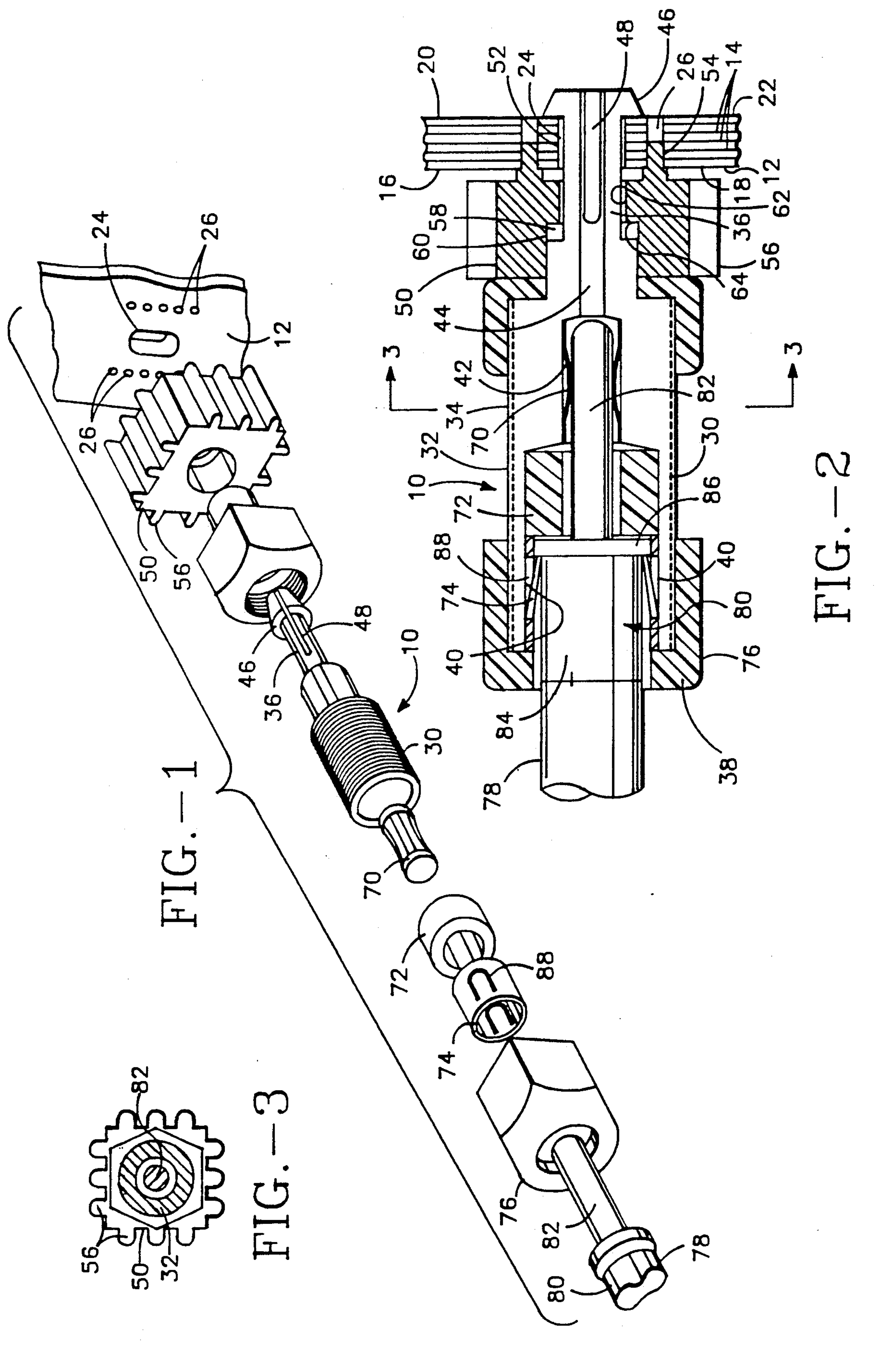
FIG. 1 is an exploded perspective view of a first embodiment of a printed circuit power plug and contact in accordance with the invention.
FIG. 2 is a partial cross section view, of the printed circuit power plug and contact of FIG. 1.
FIG. 3 is a top view of the printed circuit power plug and contact of FIGS. 1-2.

Turning now to the drawings, more particularly to FIGS. 1 and 2, there is shown a power plug 10 for a multilayer printed circuit board 12. The printed circuit board 12 has a plurality of power distribution planes 14, running principally within the circuit board 12. Another power distribution plane 16 runs along front surface 18 of the printed circuit board 12, and a similar power distribution plane 20 runs along rear surface 22 of the printed circuit board 12. The printed circuit board 12 has an oval plated through contact hole 24 and ten plated through mounting holes 26, disposed in rows of five on either side of the contact hole 24. The through plating electrically connects the contact hole 24 and the mounting holes 26 to the power distribution planes 14, 16 and 20.

The plug 10 has a main contact body 30, formed from a suitable conductive metal, such as a beryllium-copper alloy. The body 30 has a generally cylindrical portion 32, which is threaded at 34 on its outside surface along its length. An integral spring contact portion 36 projects from the cylindrical portion 32. A central bore 38 extends axially along the length of the body 30, with a first, largest diameter portion 40, a central portion 42 with an intermediate diameter, and a contact portion 44 with the smallest diameter compared to that of the portions 40 and 42. The spring contact portion 36 has enlarged tips 46 and a pair of opposed slots 48.

The portion 36 of the main contact body 30 extends through a board contact and heat sink 50 and has a contact ridge 52, which engages the plated through contact hole 24. The board contact/heat sink 50 has ten connecting legs 54, which are square in cross section and tapered toward their ends. The four corners of the square cross section bite into the through plating of the mounting holes 26. As shown in FIGS. 1 and 3, the board contact/heat sink 50 has projecting fins 56 to aid in heat dissipation. The contact/heat sink 50 has a bore 58 extending axially through the contact/heat sink 50, with a first portion 60 having a greater diameter, and a second portion 62 having a lesser diameter, with a step 64 at the intersection of the first and second portions 60 and 62. The step 64 forms a limit for the insertion of the contact portion 36 through the contact/heat sink 50.

A crown contact 70 is friction fit into portion 42 of the bore 38. A spacer 72 and a retention clip 74 fit into the portion 40 of the bore 38. A retaining cap 76 screws onto the upper end of the portion 32 of the main contact body 30 to hold the retention clip 74, spacer 72 and crown contact 70 in place within the bore 38. Wire 78 is connected to a pin contact 80, which has a tip 82 and a base 84, separated by an enlarged diameter portion 86. Retention clip 74 has prongs 88, which engage the portion 86 when the pin contact 80 is fully inserted in the bore 38.

In use, the plug 10 is installed by first inserting the legs 54 of the board contact/heat sink 50 into the mounting holes 26. Spring contact portion 36 of the contact body 30 is then inserted through the board contact/heat sink 50 into the contact hole 24 of the printed circuit board 12, with the enlarged tips 46 extending along the greater diameter of the oval. The main contact body is then rotated 90 degrees, so that the enlarged tips 46 engage the rear surface 22 of the printed circuit board 12. The pin contact 80 is then plugged into the bore 38 of the contact body 30. When it is desired to remove the pin contact 80, a removal tool is inserted into the bore 38 along the pin contact 80 to deflect the prongs 88 outward, so that the enlarged diameter portion 86 will clear the prongs 88.

Figure 4:
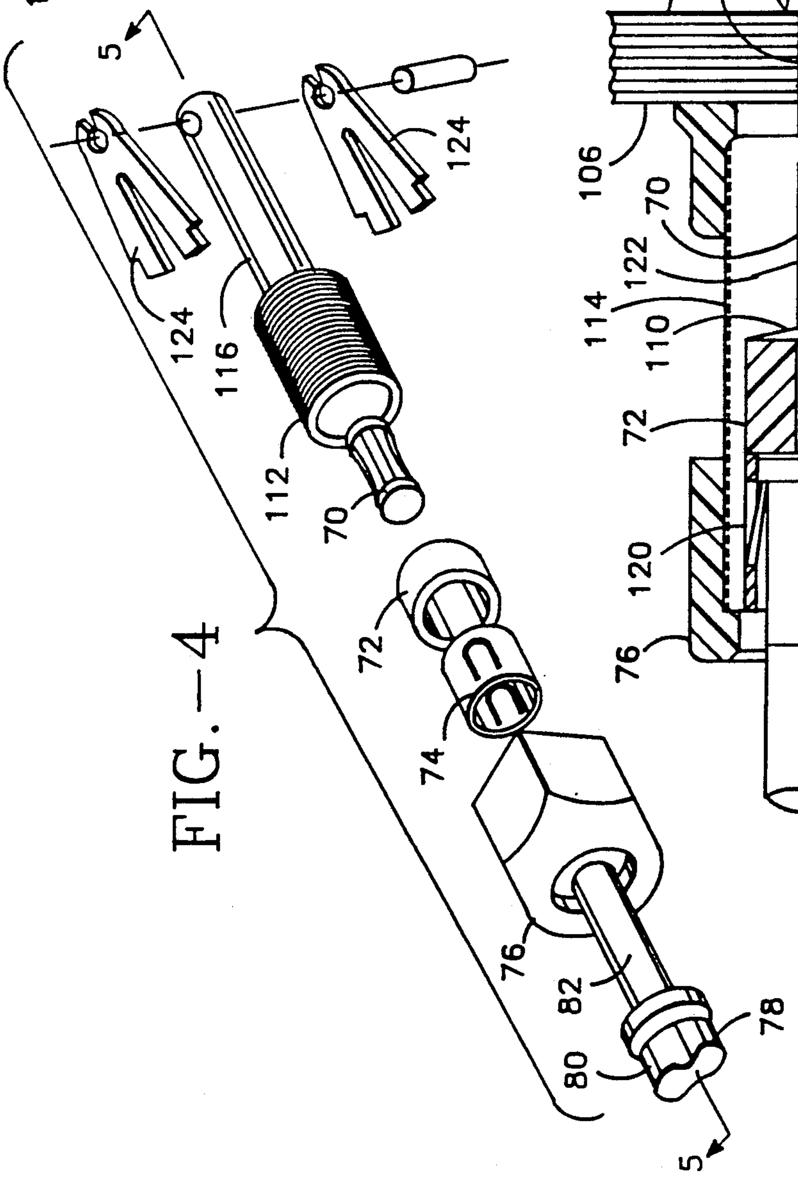
FIG. 4 is an exploded perspective view of a second embodiment of a printed circuit power plug and contact in accordance with the invention.
Figure 5:
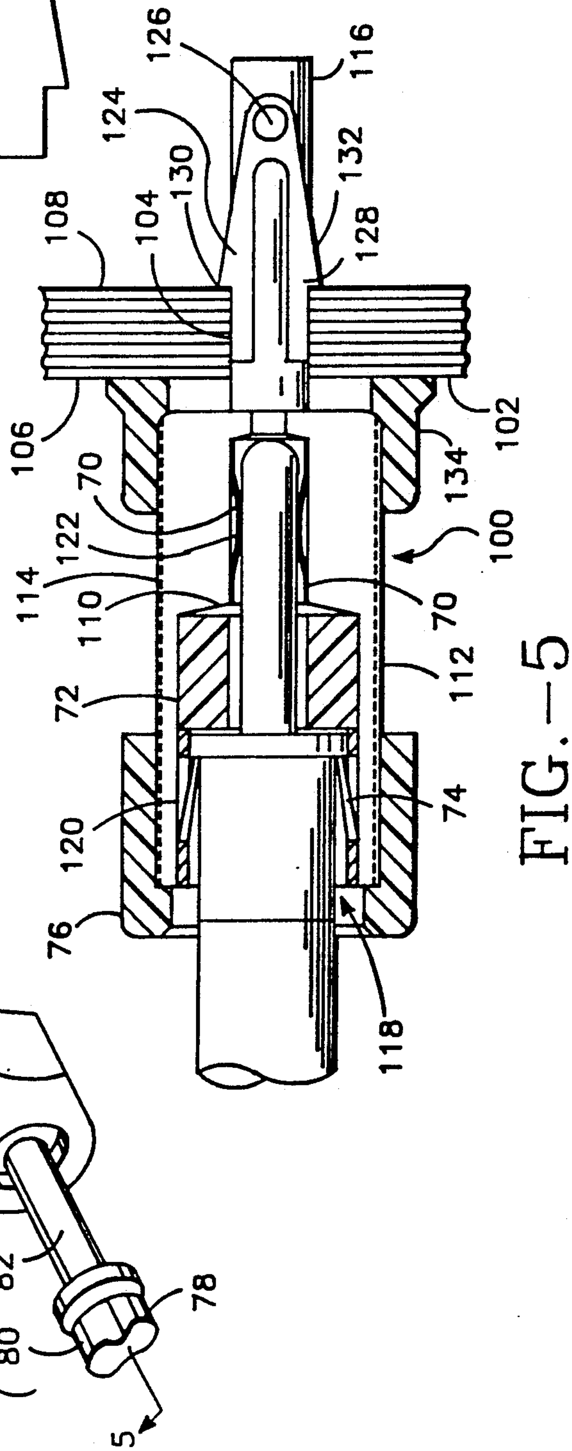
FIG. 5 is a cross section view, taken along the line 5—5 in FIG. 4 showing the printed circuit power plug and contact of FIG. 4 in use with a circuit board.

FIGS. 4–5 show another power plug 100, suitable for use with printed circuit boards 102 having conventional round plated through holes 104. The circuit board 102 is a double layer board, with power distribution planes 106 and 108 on its upper and lower surfaces, connected together through the plated through hole 104.

As in the case of the plug 10, the plug 100 has a main contact body 110, having a generally cylindrical portion 112, which is threaded at 114 on its outside surface along its length. An integral contact portion 116 projects from the cylindrical portion 112. A central bore 118 extends axially along the length of the body 110, with a first, larger diameter portion 120 and a second portion 122 with a second, smaller diameter below the first portion 120. The central bore 118 stops at the integral contact portion 116. Crown contact 70, spacer 72, retention clip 74 and retaining cap 76 function in the same manner as in the plug 10 of FIGS. 1–3.

Figure 6:
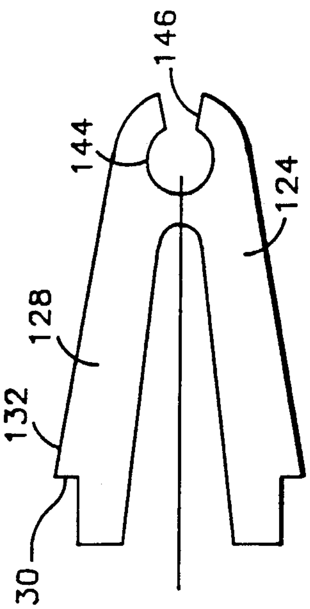
FIG. 6 is a plan view of a portion of the contact of the printed circuit power plug and contact of FIGS. 4-5.

A blue spring steel locking spring 124 is pinned to the contact portion 116 of the main body 110 at 126. The locking spring 124 has upwardly extending prongs 128 with detents 130 on their outer edges 132. Details of the spring 124 are shown in FIG. 6. In use of the plug 100, when the contact portion 116 is inserted through the plated-through hole 104 from the front side of the circuit board 102, the spring pass through the hole, and detents 130 engage the lower surface of the circuit board 102. The lock nut 134 is then screwed down against the top surface of the circuit board 102 to lock the plug 100 in position. Other than as shown and described, the construction and operation of the plug 100 is the same as that of the plug 10.

Figure 7:
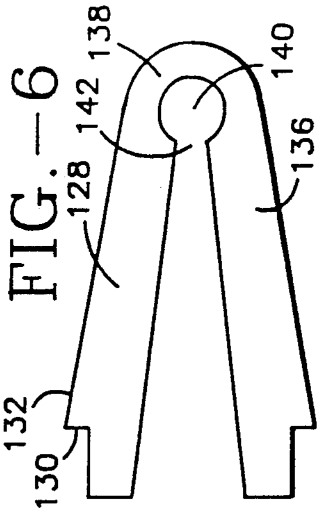
FIG. 7 is plan view similar to that of FIG. 6, but of another form of a contact portion corresponding to that of FIG. 6.

An alternative spring 136 is shown in FIG. 7. The spring 136 differs from the spring 124 in the shape of its end 138 around the pin 126 for attaching it to the contact portion 116. Aperture 140 of the spring 136 for receiving the pin 126 has a split 142 facing upward, while corresponding aperture 144 of the spring 124 has a split 146 facing downward.

It should now be readily apparent to those skilled in the art that a novel power plug capable of achieving the stated objects of the invention has been provided. The plugs 10 and 100 are mechanically mounted to the printed circuit board, without soldering. They are front mounted to the printed circuit board, with no necessity to access the back side of the printed circuit board. No additional parts need be mounted on the back of the printed circuit board in order to attach the plugs 10 or 100 to the printed circuit board. The plugs 10 and 100 provide a positive lock for attachment to the printed circuit board and a contact pin of the plug provides a positive lock into the plug.

It should further be apparent to those skilled in the art that various changes in form and details of the invention as shown and described may be made. It is intended that such changes be included within the spirit and scope of the claims appended hereto.

What is claimed is:

1. A plug for transmitting power to a printed circuit board, which comprises a main contact body, an integral contact portion projecting from said main contact body, said integral contact portion being a spring contact configured and dimensioned to extend through a main contact aperture from an upper surface of a printed circuit board beyond a lower surface of the printed circuit board, said spring contact having enlarged tips for engaging the lower surface of the printed circuit board when said spring contact is extended through the main contact aperture beyond the lower surface of the circuit board, and means for engaging the upper surface of the printed circuit board to lock said main contact body and said spring contact in position on the printed circuit board.

2. The plug of claim 1 in which said spring contact includes a pair of opposed slots separating said enlarged tips of said spring contact.

3. The plug of claim 2 in which said spring contact is dimensioned and configured for insertion in the main contact aperture of the printed circuit board having a greater cross-section dimension in a first direction and a lesser cross-section dimension in a second direction at an angle to the first direction, and said enlarged tips are dimensioned and configured to pass freely through the main contact aperture when oriented substantially along the first direction and to engage the lower surface of the printed circuit board when the enlarged tips are oriented substantially along the second direction.

4. A plug for transmitting power to a printed circuit board, which comprises a main contact body having a bore for a pin contact, said bore extending into said main contact body at an end thereof, an integral contact portion projecting from an end of said main contact body remote from the entrance of said bore, said integral contact portion being configured and dimensioned to extend through a main contact aperture from an upper surface of a printed circuit board beyond a lower surface of the printed circuit board, means on said integral contact portion for engaging the lower surface of the printed circuit board when said integral contact portion is extended through the aperture beyond a lower surface of the circuit board, and means for engaging the upper surface of the printed circuit board to lock said main contact body and said integral contact portion in position on the printed circuit board.

5. The plug of claim 4 in which said bore includes a crown contact member positioned to engage a distal end of a pin contact, a spacer over said crown contact, and a retaining member over said spacer for locking engagement with a surface of the pin contact when the pin contact is fully inserted in said bore.

6. A plug for transmitting power to a printed circuit board, which comprises a main contact body having a threaded outer surface, an integral contact portion projecting from said main contact body, said integral contact portion being configured and dimensioned to extend through a main contact aperture from an upper surface of a printed circuit board beyond a lower surface of the printed circuit board, means on said integral contact portion for engaging the lower surface of the printed circuit board when said integral contact portion is extended through the aperture beyond the lower surface of the circuit board, a locking nut threaded to the outer surface of the main contact body, and a board contact member and heat sink separating said locking nut from the printed circuit board, said means for engaging the lower surface of the circuit board and said locking nut being adapted to cooperate to urge said board contact member and heat sink against the upper surface of the printed circuit board to lock said main contact body in position on the circuit board, said board contact member and heat sink having a plurality of connecting legs dimensioned and configured for insertion in a like plurality of additional contact apertures in the printed circuit board adjacent to the main contact aperture.

7. The plug of claim 4 in which said means on said integral contact portion for engaging the lower surface of the printed circuit board when said integral contact portion is extended through the main contact aperture beyond the lower surface of the circuit board comprises a locking spring attached to said integral contact portion, said locking spring having a surface for engaging the lower surface of the printed circuit board when the surface of said locking spring is inserted past the main contact aperture of the printed circuit board.

8. The plug of claim 7 in which said locking spring comprises a pair of upwardly extending prongs and said surface for engaging the lower surface of the printed circuit board comprises detents on outer edges of said locking spring.

9. The plug of claim 8 in which said locking spring has a split ring at a base end of the upwardly extending prongs for receiving a fastener attaching said locking spring to said integral contact portion.

10. The plug of claim 9 in which the split ring has a split facing downward.

11. The plug of claim 9 in which the split ring has a split facing upward.

* * * * *